(12) United States Patent
Nishinaka et al.

(10) Patent No.: US 8,822,945 B2
(45) Date of Patent: Sep. 2, 2014

(54) FOCUSED ION BEAM APPARATUS

(75) Inventors: Kenichi Nishinaka, Chiba (JP); Takashi Ogawa, Chiba (JP); Yoshihiro Koyama, Chiba (JP)

(73) Assignee: SII NanoTechnology Inc. (JP)

( * ) Notice: Subject to any disclaimer, the term of this patent is extended or adjusted under 35 U.S.C. 154(b) by 0 days.

(21) Appl. No.: 13/065,698

(22) Filed: Mar. 28, 2011

(65) Prior Publication Data

US 2011/0233401 A1    Sep. 29, 2011

(30) Foreign Application Priority Data

Mar. 29, 2010   (JP) ................................. 2010-076336

(51) Int. Cl.
 *G01N 23/225*   (2006.01)
 *H01J 49/42*    (2006.01)
 *H01J 3/26*     (2006.01)

(52) U.S. Cl.
 USPC .................. 250/396 R; 250/423 R; 250/309; 250/492.21; 250/492.3; 313/336; 313/230

(58) Field of Classification Search
 USPC ............... 313/230, 336, 359.1, 362.1, 363.1; 250/306, 307, 309, 396 R, 397–399, 250/423 R, 423 F, 424, 429, 492.1, 492.21, 250/492.3, 522.1, 526, 580, 582, 584, 586, 250/587
 See application file for complete search history.

(56) References Cited

U.S. PATENT DOCUMENTS

| | | | | |
|---|---|---|---|---|
| 4,457,803 A | | 7/1984 | Takigawa ...................... 156/626 |
| 4,994,711 A | * | 2/1991 | Matossian .................. 313/362.1 |
| 5,055,696 A | * | 10/1991 | Haraichi et al. ........... 250/492.2 |
| 5,116,782 A | * | 5/1992 | Yamaguchi et al. ........ 250/492.3 |
| 5,952,658 A | * | 9/1999 | Shimase et al. .................. 850/63 |
| 6,750,451 B2 | * | 6/2004 | Koguchi et al. ............... 250/311 |
| 7,595,490 B2 | * | 9/2009 | Zhou et al. ..................... 250/310 |
| 7,755,065 B2 | * | 7/2010 | Nakagawa et al. ...... 250/492.21 |
| 8,124,941 B2 | * | 2/2012 | Notte et al. ................ 250/423 F |
| 8,263,943 B2 | * | 9/2012 | Shichi et al. .............. 250/423 R |
| 2003/0189172 A1 | | 10/2003 | Sawahata et al. ............. 250/310 |

(Continued)

FOREIGN PATENT DOCUMENTS

| JP | 58106750 | 6/1983 |
|---|---|---|
| JP | 64035843 | 2/1989 |

(Continued)

OTHER PUBLICATIONS

Abstract, publication No. JP07-192669, publication date Jul. 28, 1995.

*Primary Examiner* — Bernard E Souw
(74) *Attorney, Agent, or Firm* — Adams & Wilks

(57) ABSTRACT

A focused ion beam apparatus includes a gas field ion gun unit having an emitter, an ion source gas supply unit for supplying different ion source gases to the emitter, a heater for heating the emitter, and an extraction electrode. A storage section stores, for each gas of a plurality of different types, set values of emitter temperature, gas pressure, extraction voltage to be applied to an extraction electrode, image contrast and image brightness. An input section selects and inputs one of the gas types. A control section reads, from the storage section, the set values of emitter temperature, gas pressure, extraction voltage, image contrast and image brightness, which correspond to the input gas type, and sets a heater, a gas control section, a voltage control section, and an adjustment section for the contrast and brightness of the image.

7 Claims, 3 Drawing Sheets

(56) References Cited

U.S. PATENT DOCUMENTS

| | | | |
|---|---|---|---|
| 2004/0129878 A1* | 7/2004 | Tomimatsu et al. | 250/307 |
| 2004/0183016 A1 | 9/2004 | Sawahata et al. | 250/310 |
| 2005/0199828 A1* | 9/2005 | Tokuda et al. | 250/492.3 |
| 2007/0228287 A1* | 10/2007 | Ward et al. | 250/424 |
| 2007/0284538 A1* | 12/2007 | Zani et al. | 250/398 |
| 2008/0217555 A1* | 9/2008 | Ward et al. | 250/423 F |
| 2008/0308741 A1* | 12/2008 | Nakagawa et al. | 250/396 R |
| 2009/0200484 A1 | 8/2009 | Frosien | 250/396 |
| 2010/0176296 A1 | 7/2010 | Kaito et al. | 250/307 |
| 2010/0219339 A1* | 9/2010 | Ogawa et al. | 250/306 |
| 2011/0204252 A1* | 8/2011 | Ogawa et al. | 250/396 R |
| 2011/0215256 A1* | 9/2011 | Ogawa et al. | 250/396 R |

FOREIGN PATENT DOCUMENTS

| | | |
|---|---|---|
| JP | 01265429 | 10/1989 |
| JP | 02037649 | 2/1990 |
| JP | 02066845 | 3/1990 |
| JP | 03110743 | 5/1991 |
| JP | 2001084942 | 3/2001 |
| JP | 2005026192 | 1/2005 |
| JP | 2008270039 | 11/2008 |
| JP | 2009187950 | 8/2009 |
| WO | 2009020150 | 2/2009 |

* cited by examiner

FOCUSED ION BEAM APPARATUS

BACKGROUND OF THE INVENTION

1. Field of the Invention

The present invention relates to a focused ion beam apparatus including a gas field ion source.

2. Description of the Related Art

Conventionally, a liquid metal gallium ion source has been used in a focused ion beam apparatus. The focused ion beam apparatus uses gallium to perform stable beam irradiation, and hence the focused ion beam apparatus has been used for defect repair of a mask used in lithography, for manufacturing a specimen of a transmission electron microscope, and the like. However, there is a problem in that, after ion beam irradiation, gallium may still remain in the specimen.

Further, as an apparatus using nonmetal ion species, a focused ion beam apparatus including a gas field ion source is developed, in which an ion source gas is supplied to a fine emitter, and the ion source gas species adsorbed on the emitter are ionized by a strong electric field generated at a tip of the emitter, to thereby generate an ion beam (see Japanese Patent Publication No. H07-192669). In an apparatus constituted as described above, because a nonmetal gas ion is used as an ion source, there does not occur such a problem that, after beam irradiation, a metal still remains in the specimen.

However, in the conventional focused ion beam apparatus, the ion species of the ion source cannot be switched easily, and hence only one ion species has been used. Therefore, the same ion species has been required to be used in both processing and observation.

SUMMARY OF THE INVENTION

The present invention has been made in view of the above-mentioned circumstances, and therefore has an object to provide a focused ion beam apparatus capable of switching ion species of an ion source easily to use an appropriate ion species according to the use.

In order to achieve the above-mentioned object, the present invention provides the following measures.

A focused ion beam apparatus according to the present invention includes: a needle-like emitter; a heater for heating the emitter to regulate a temperature of the emitter; an ion source gas supply unit for supplying ion source gases of a plurality of gas types to the emitter; an extraction electrode for extracting ions from the emitter; a lens system for focusing the ions; a specimen stage on which a specimen is to be placed, the specimen being irradiated with an ion beam focused by the lens system; a detector for detecting secondary charged particles emitted from the specimen; an image formation section for forming an observation image of the specimen from a detection signal of the detector; a display unit for displaying the observation image; an adjustment section for adjusting a contrast and a brightness of the observation image; a storage section for storing, for each of the plurality of gas types, a set temperature of the emitter, a gas pressure of corresponding one of the ion source gases, an extraction voltage to be applied to the extraction electrode, a set value of the contrast, and a set value of the brightness; an input section for selecting a gas type from the plurality of gas types and inputting the selected gas type; and a control section for reading out, from the storage section, the set temperature of the emitter, the gas pressure, the extraction voltage, and the set value of the contrast and the set value of the brightness, which correspond to the input gas type, and respectively setting the heater, the ion source gas supply unit, the extraction electrode, and the adjustment section. With this, for each of the plurality of gas types, the set temperature of the emitter, the gas pressure of the ion source gas, the extraction voltage to be applied to the extraction electrode, the set value of the contrast, and the set value of the brightness may be set in advance. When the gas type is switched, the control section may read out the set temperature of the emitter, the gas pressure of the ion source gas, the extraction voltage to be applied to the extraction electrode, the set value of the contrast, and the set value of the brightness, which correspond to the switched gas type, and the control section may set the respective set values to the heater, the ion source gas supply unit, the extraction electrode, and the adjustment section.

Further, in the focused ion beam apparatus according to the present invention, the storage section may store, for each of the plurality of gas types, a set value of a timing to apply a voltage to a blanking electrode, and the control section may set, to the blanking electrode, the set value of the timing corresponding to the input gas type. With this, for each of the plurality of gas types, an appropriate timing to apply a voltage to the blanking electrode may be stored in the storage section, and when the gas type is switched, the control section may read out the set value of the timing corresponding to the switched gas type, and the control section may set the appropriate timing to the blanking electrode.

According to the focused ion beam apparatus of the present invention, it is possible to switch the ion species easily, and hence an appropriate ion species may be used according to the use.

DETAILED DESCRIPTION OF THE PREFERRED EMBODIMENT

Hereinafter, an embodiment of a focused ion beam apparatus according to the present invention is described.

Figure 1:
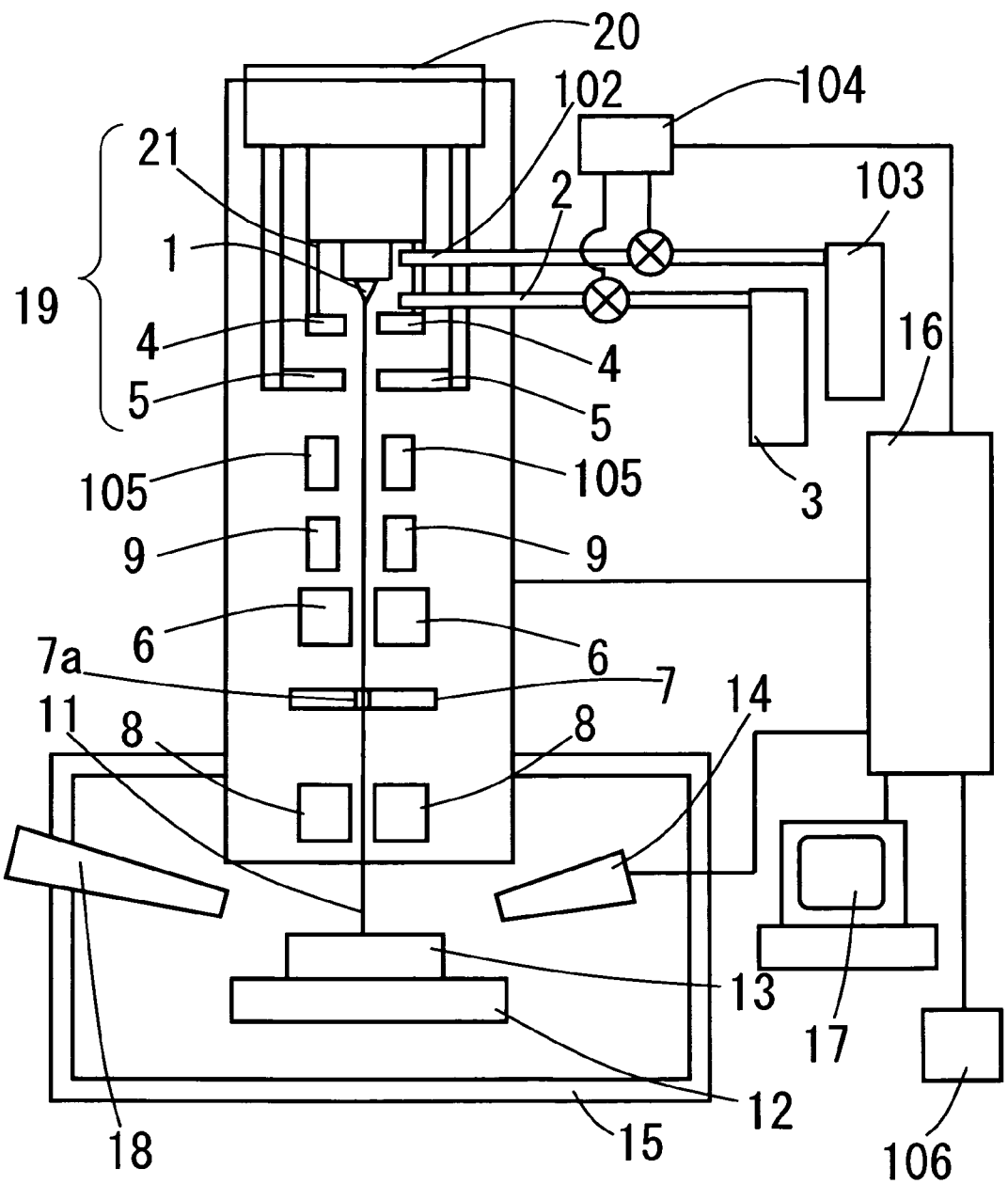
FIG. 1 is a structural diagram of a focused ion beam apparatus according to an embodiment of the present invention.

As illustrated in FIG. 1, the focused ion beam apparatus according to this embodiment includes an ion gun unit 19. The ion gun unit 19 includes a gas supply unit. The gas supply unit includes a needle-like emitter 1, ion source gas nozzles 2 and 102 for supplying gas to the emitter 1, a first ion source gas supply source 3, a second ion source gas supply source 103, and a gas control section 104 for controlling gas supply. The ion gun unit 19 further includes an extraction electrode 4 for extracting ions, by applying a voltage between the emitter 1 and the extraction electrode 4 and ionizing the gas adsorbed on the surface of the emitter 1, and a cathode electrode 5 for accelerating the ions toward a specimen 13. Further, a lens system is provided, which includes a focusing lens electrode 6 for focusing an ion beam 11 on the specimen 13 and an objective lens electrode 8. Further, an aperture 7 having an opening 7a is provided between the focusing lens electrode 6 and the objective lens electrode 8. Further, the aperture 7 has an opening with a different opening size. By selecting one of the openings having different opening sizes, and placing the selected opening on the way of the beam axis, the beam amount of the ion beam 11 passing therethrough may be adjusted. Further, an adjusting mechanism 20 is provided, which enables the ion gun unit 19 to move relatively with respect to the lens system from the outside of the apparatus.

Further, a gun alignment electrode 9 is provided, which is positioned closer to the specimen 13 than the ion gun unit 19, for adjusting the irradiation direction of the ion beam 11 emitted from the ion gun unit 19. Further, there is provided a blanking electrode 105 for deflecting the ion beam 11 to prevent the ion beam 11 from reaching the specimen 13 in a case where the specimen 13 is required not to be irradiated with the ion beam 11. Further, a specimen chamber 15 is provided, inside of which is in a vacuum state. The specimen chamber 15 includes a movable specimen stage 12 on which the specimen 13 is to be placed, a gas gun 18 for supplying a deposition or an etching gas to the specimen 13, and a detector 14 for detecting secondary charged particles generated from the specimen 13. Here, although not shown, a valve is provided to screen the vacuum between the specimen chamber 15 and the ion gun unit 19. Further, there is provided a system control unit 16 for controlling the focused ion beam apparatus. The system control unit 16 includes an image formation section 304 (FIG. 3) for forming an observation image by a detection signal detected by the detector 14 and a scanning signal of the ion beam. The formed observation image is displayed on a display unit 17. Further, there is provided an input section 106 for inputting conditions of the beam irradiation, such as gas types.

(1) Gas Field Ion Source

Figure 2:
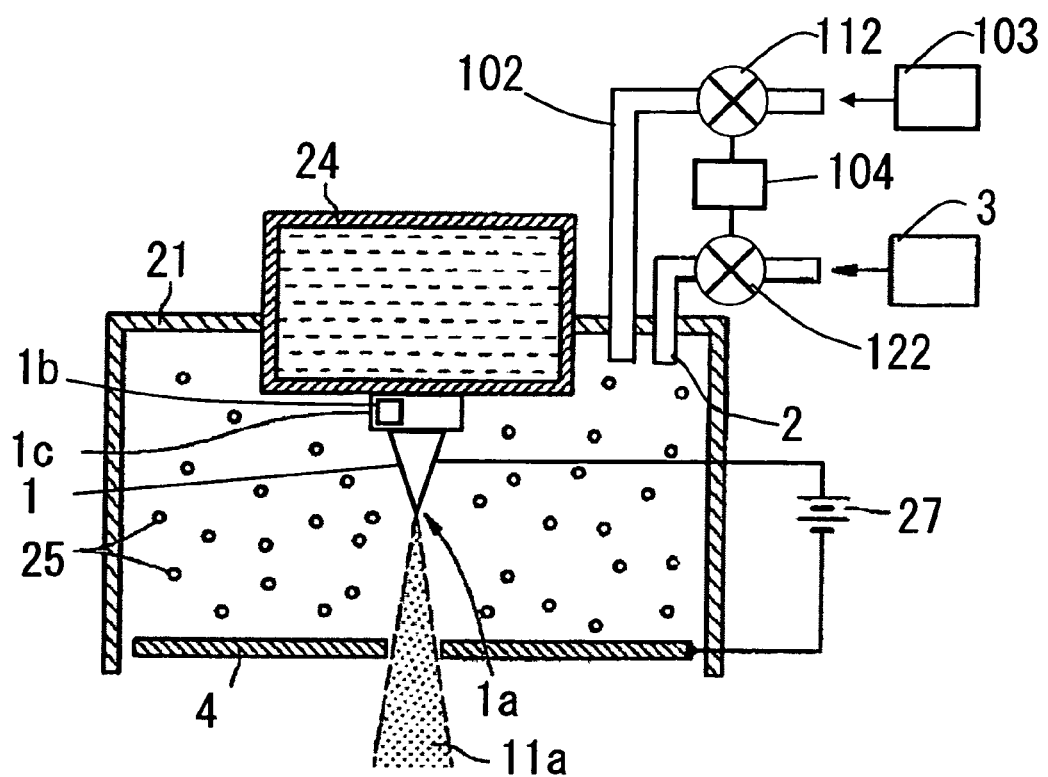
FIG. 2 is a structural diagram of an ion source of the focused ion beam apparatus according to the embodiment of the present invention.

As illustrated in FIG. 2, the gas field ion source includes an ion generation chamber 21, the emitter 1, the extraction electrode 4, and a cooling device 24.

The cooling device 24 is disposed on a wall of the ion generation chamber 21, and the needle-like emitter 1 is mounted on a surface of the cooling device 24 facing the ion generation chamber 21. The emitter 1 is provided with a mechanism for heating the emitter to regulate the emitter temperature, by supplying a current to a heater 1b provided in a block is supporting the emitter 1. The gas field ion source also includes a sensor for detecting the temperature of the emitter 1. The cooling device 24 cools the emitter 1 by a cooling medium such as liquid nitrogen or liquid helium contained in the cooling device 24. Further, as the cooling device 24, a closed-cycle refrigerator, such as a GM refrigerator or a pulse tube refrigerator, or a gas flow refrigerator may be used. Further, the gas field ion source has a temperature control function capable of regulating the temperature to the optimum temperature in accordance with the ion species. Further, the extraction electrode 4 is disposed in the vicinity of an opening end of the ion generation chamber 21 so that an opening thereof is positioned opposed to a tip 1a of the emitter 1.

The inside of the ion generation chamber 21 is maintained in a desired high vacuum state by an exhauster. The ion generation chamber 21 has a plurality of orifices for generating difference in vacuum degree between the specimen chamber 15 and the ion gun unit 19. With those orifices, the ionized gas is prevented from flowing into the specimen chamber and also the gas to be introduced into the specimen chamber is prevented from flowing into the ion gun unit. The ion generation chamber 21 is connected to the first ion source gas supply source 3 or the second ion source gas supply source 103 via the ion source gas nozzle 2 or the ion source gas nozzle 102. The ion source gas nozzles are used to supply a small amount of gas (for example, Ar gas) into the ion generation chamber 21. The gas control section 104 controls the opening/closing of a valve 112 and a valve 122, to thereby control the gas supply. Further, the valve 112 and the valve 122 may be used to adjust the flow amount.

The gas supplied from the ion source gas supply source 3 is not limited to the Ar gas, and may be a gas such as helium (He), neon (Ne), krypton (Kr), xenon (Xe), hydrogen ($H_2$), oxygen ($O_2$), and nitrogen ($N_2$). Further, the ion source gas supply source 3 may be constituted to be capable of supplying a plurality of types of gases, switching the gas types according to the use, or mixing one of more gas types.

The emitter 1 is a member obtained by coating a needle-like base made of tungsten or molybdenum with a noble metal such as platinum, palladium, iridium, rhodium, or gold. The emitter 1 has the tip 1a, which is sharpened at an atomic level so as to have a pyramid shape. Alternatively, the emitter 1 to be used may be a member in which the tip 1a of the needle-like base made of tungsten or molybdenum is sharpened at an atomic level by introducing a nitrogen gas or an oxygen gas. Further, when the ion source is operated, the emitter 1 is maintained at a low temperature of about 100° K or lower by the cooling device 24. An extraction voltage is applied between the emitter 1 and the extraction electrode 4 by a voltage control section 27.

When a voltage (extraction voltage) is applied between the emitter 1 and the extraction electrode 4, a significantly large electric field is generated in the sharply pointed tip 1a. Then, gas molecules 25 which are polarized and attracted to and adsorbed on the emitter 1 lose electrons so as to become gas ions by tunneling at a position of the tip 1a having the highest electric field. Then, the gas ions are repulsed against the emitter 1 held at a positive potential and shoot out to the extraction electrode 4 side. Ions 11a exited from the opening of the extraction electrode 4 to the lens system form the ion beam 11. Here, it is preferred that the extraction electrode 4 and a center position of the tip of the emitter 1 be provided within 10 micron meters. Further, a suppress electrode for giving a negative potential to the emitter 1 may be provided between the emitter 1 and the extraction electrode 4.

The tip 1a of the emitter 1 has an extremely sharpened shape, and the gas ions ionize at the limited region in the upper portion of the tip 1a. Therefore, the energy distribution width of the ion beam 11 is extremely narrow, and it is possible to obtain an ion beam with small beam diameter and high luminance compared with, for example, a plasma gas ion source or a liquid metal ion source.

When the voltage applied to the emitter 1 is extremely large, not only the gas ions but also the constituent element (tungsten or platinum) of the emitter 1 flies toward the extraction electrode 4. Therefore, the voltage applied to the emitter 1 at the time of ion beam radiation is maintained at a voltage for preventing the constituent element of the emitter 1 itself from shooting out.

Meanwhile, the shape of the tip 1a can be adjusted by using the fact that the constituent element of the emitter 1 can be handled as described above. For example, the ion beam diameter may be increased by widening the region for ionizing the gas by intentionally removing an element located at the uppermost end of the tip 1a.

Further, the emitter 1 can be heated so that the noble metal element on the surface thereof is rearranged without shooting out. Therefore, it is also possible to recover the sharpened shape of the tip 1a which thickens with use.

(2) Ion Gun Unit

As illustrated in FIG. 1, the ion gun unit 19 includes the cathode electrode 5 for accelerating the ions 11a, which have passed through the extraction electrode 4 of the gas field ion source, toward the specimen 13. Further, the ion gun unit 19 is connected to the adjusting mechanism 20. The adjusting mechanism 20 causes the ion gun unit 19 to move relatively with respect to the lens system from the outside of the vacuum. With this, it is possible to adjust the position of the ion beam 11 entering the lens system.

(3) Lens System

The lens system includes, in order from the emitter 1 side to the specimen 13 side, the focusing lens electrode 6 for focusing the ion beam 11, the aperture 7 which narrows the ion beam 11, an aligner for adjusting the optical axis of the ion beam 11, a stigmator for correcting an astigmatism of the ion beam 11, the objective lens electrode 8 for focusing the ion beam 11 on the specimen 13, and a scanner for scanning the ion beam 11 on the specimen.

In the focused ion beam apparatus constituted as described above, the source size can be set to 1 nm or smaller and the energy spread of the ion beam can be set to 1 eV or smaller, and hence the beam diameter can be narrowed to 1 nm or smaller. Although not shown, the focused ion beam apparatus may include a mass filter, such as an ExB mass filter, for filtering ions based on an atomic number.

(4) Gas Gun

The gas gun 18 supplies a raw material gas (for example, a carbon-based gas such as phenanthrene and naphthalene, and a metal compound gas containing a metal such as platinum and tungsten) of the deposition film on the surface of the specimen 13 from a raw material container through a nozzle.

Additionally, when etching is performed, an etching gas (for example, xenon fluoride, chlorine, iodine, chlorine trifluoride, nitric oxide, and water) may be supplied from the raw material container through the nozzle.

(5) Ion Source Gas Switching Control

When the ion source gas is switched, conditions related to ion beam irradiation and image observation are required to be switched appropriately.

With regard to the extraction voltage, field ionization intensity differs depending on the gas type, and hence the extraction voltage having the maximum current density also differs.

With regard to the emitter temperature, the optimum operation temperature of the emitter differs depending on the gas type.

With regard to the gas pressure, discharge start pressure differs depending on the gas type, and hence the gas pressure having the maximum current density also differs.

With regard to the timing of blanking, mass differs depending on the gas type, and hence the time of flight of ions to reach the specimen from the emitter also differs. Therefore, the timing to apply a voltage to the blanking electrode also differs.

Further, with regard to a contrast and a brightness of the observation image, generation efficiency of the secondary electrons emitted from the specimen differs depending on the irradiated ion species, and hence set values of the contrast and the brightness appropriate for image observation also differ.

Figure 3:
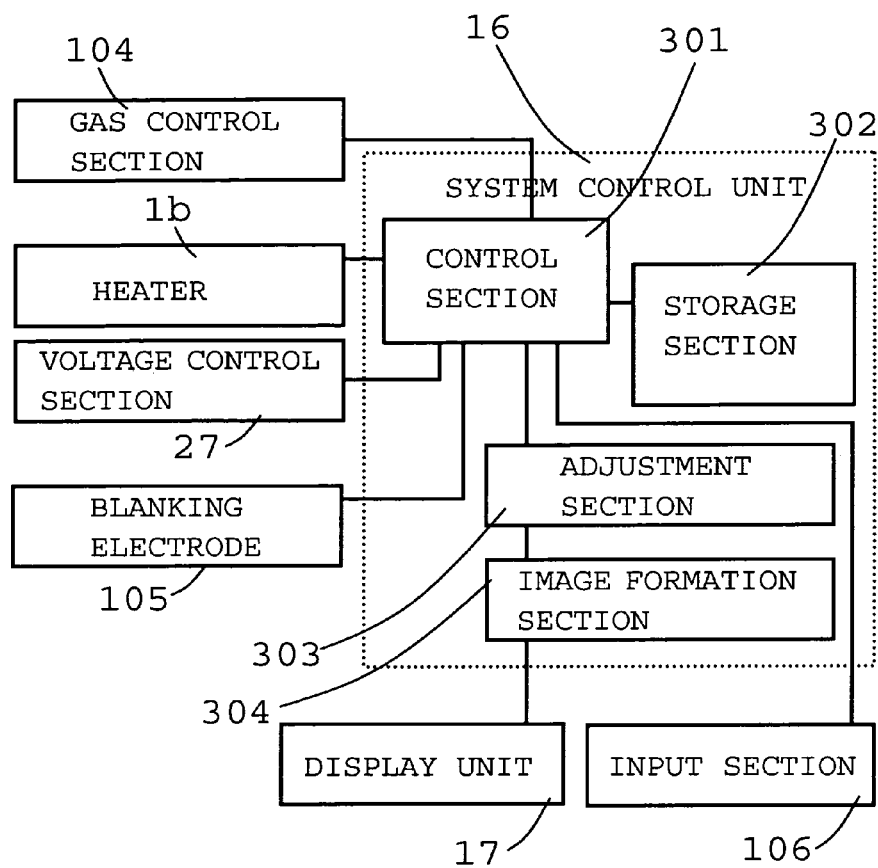
FIG. 3 is a schematic diagram of a system control system of the focused ion beam apparatus according to the embodiment of the present invention.

Therefore, when the gas type is switched, the set values of the extraction voltage, the emitter temperature, the gas pressure, the timing of blanking, and the contrast and the brightness of the observation image are switched. As illustrated in FIG. 3, the input section 106 inputs the set values for each of the gas types to a control section 301 in the system control unit 16. The input set values are stored in a storage section 302. When the gas type is switched, the control section 301 reads out the set values stored in the storage section 302. Then, the read-out set values are sent from the control section 301 to the gas control section 104, the heater 1b, the voltage control section 27, the blanking electrode 105, and an adjustment section 303 for adjusting the contrast and the brightness of the observation image. As described above, by storing in advance the set values for each of the gas types, which are capable of obtaining the maximum current density and enable image observation, and by switching the set values when the gas type is switched, it is possible to automatically set the optimum conditions for beam irradiation and observation for each of the gas types.

EXAMPLE

Description is given of an example in which the gas type is switched from helium to argon.

(1) Preliminary Setting

The current amount of the ion beam notably increases when the emitter temperature is cooled to around the boiling point of the gas, and decreases when the emitter temperature is cooled to the boiling point or lower. Therefore, in order to obtain a large current amount of the ion beam, it is preferred to control the emitter temperature to be around the boiling point of the gas. The boiling points of helium and argon are respectively stored in the storage section 302 as the emitter temperature for each of the gases.

Here, the current amount of the ion beam increases in proportion to the gas pressure of the ion generation chamber 21. However, as the gas pressure increases, there also increases the possibility that the emitter 1 is discharged to be broken. The discharge start pressures of helium and argon are stored in the storage section 302. When the gas pressure of the ion generation chamber 21 exceeds the discharge start pressure, the control section 301 sends a signal for stopping the application of the extraction voltage to the voltage control section 27, to thereby stop the voltage application.

The time of flight of the ion beam 11 to reach the specimen 13 from the emitter 1 is proportional to m/2, where m represents mass of the gas. Therefore, the timing to apply a voltage to the blanking electrode 9 is required to be changed depending on the gas type.

Here, the blanking electrode acts as follows. When the ion beam irradiation time period is set, the control section 301 controls the irradiation of the ion beam 11 onto the specimen 13 to be performed only within the ion beam irradiation time period. When the irradiation time period is exceeded, a voltage is applied to the blanking electrode 9 to deflect the ion beam 11, to thereby prevent the ion beam 11 from reaching the specimen 13. Further, when the specimen 13 is irradiated with the ion beam 11 only within the ion beam irradiation time period, the timing of the application of the voltage to the blanking electrode 9 is required to consider the time of flight of the ion beam 11 which travels through a distance between the blanking electrode 9 and the specimen 13. This is because, even when the blanking voltage is applied, the ion beam 11 traveling between the blanking electrode 9 and the specimen 13 is undesirably applied to the specimen 13. Therefore, the time period from the start of the ion beam irradiation to the application of the blanking voltage is described as follows. (Ion beam irradiation time period)–(Time period of the ion beam to travel between the blanking electrode 9 and the specimen 13)

Accordingly, the timings of blanking for helium and argon are stored in the storage section 302. The control section 301 reads out the timing from the storage section 302 when the gas type is switched, and sends an instruction to apply a voltage to the blanking electrode 9 at the read-out timing of blanking.

(2) Setting of Helium Gas Conditions

First, the tip of the emitter 1 is formed in a pyramid shape. This is performed by annealing the emitter 1 for 5 minutes at 700° C. Next, the temperature of the emitter 1 is set to the boiling point temperature of helium, which is stored in the storage section 302. The temperature of the emitter 1 is detected by the sensor. The emitter 1 is cooled by the cooling device 24, and hence the control section 301 sends an instruction to the heater 1b to heat the heater 1b, to thereby regulate the temperature of the emitter 1 to be the boiling point temperature of helium. Then, the control section 301 sends an instruction to the gas control section 104 to control the helium gas so that the vacuum degree in the ion generation chamber 21 becomes $10^{-3}$ Pa. The gas control section 104 controls the valve 122 so as to supply the helium gas from the first ion source gas supply source 3 to the ion generation chamber 21 through the ion source gas nozzle 2. Then, the ion beam 11 is radiated and an FIM image is observed. As the extraction voltage increases gradually, the tip of the emitter 1 changes from a single pattern made of one atom to a trimer pattern made of three atoms, and further to a ridgeline pattern of a threefold symmetry pyramid. The change is confirmed by the FIM image. With this, it is confirmed that the tip of the emitter 1 is formed in a pyramid shape. Here, when the above-mentioned change is not confirmed, the emitter 1 is annealed again and the FIM image is confirmed. Next, in the case where it is confirmed that the tip is formed in a pyramid shape, the extraction voltage when the tip of the emitter 1 is in a single pattern and the extraction voltage when the tip of the emitter 1 is in a trimer pattern are respectively stored. Then, the emitter 1 is annealed again to be formed in the pyramid shape. Next, the extraction voltage is gradually increased from the extraction voltage when the tip is in a single pattern to the extraction voltage when the tip is in a trimer pattern, and the current amount of the ion beam 11 emitted at that time is measured. Then, the extraction voltage when the tip is in a single pattern and the current amount of the ion beam is maximum is stored in the storage section 302 as the extraction voltage for the helium gas.

Next, the extraction voltage is set to the extraction voltage for the helium gas, and the helium gas is gradually introduced additionally so that the pressure becomes around the discharge start pressure of the helium gas. The current amount of the ion beam 11 at this time is measured, and the gas pressure at the time of the maximum current amount is stored in the storage section 302 as the gas pressure for the helium gas.

Next, the ion beam 11 is scanned and applied to the specimen 13, the secondary electrons generated from the specimen 13 are detected by the detector 14, the observation image is formed in the image formation section 304, and the formed observation image is displayed on the display unit 17. While confirming the displayed observation image, the contrast and the brightness are adjusted so as to be appropriate for observation. The set values of the contrast and the brightness, which are adjusted at this time, are stored in the storage section 302 as the set values of the contrast and the brightness for the helium gas.

By the above-mentioned steps, the extraction voltage, the emitter temperature, the gas pressure, and the set values of the contrast and the brightness for the helium gas have been set in the storage section 302.

(3) Setting of Argon Gas Conditions

Next, the extraction voltage is set to 0 V. Then, the helium gas in the ion generation chamber 21 is exhausted. Then, the control section 301 sends an instruction to the heater 1b so as to regulate the temperature of the emitter 1 to the boiling point temperature of argon, which is stored in the storage section 302. Then, the control section 301 sends an instruction to the gas control section 104 to control the argon gas so that the vacuum degree in the ion generation chamber 21 becomes $10^{-3}$ Pa. The gas control section 104 controls the valve 112 so as to supply the argon gas from the second ion source gas supply source 103 to the ion generation chamber 21 through the ion source gas nozzle 2. Next, the extraction voltage for the argon gas is set. The field ionization intensity necessary for ionization of gas is fixed depending on the gas type, and the extraction voltage for the argon gas is expressed as follows. (Extraction voltage for helium gas)·(Field ionization intensity of argon)/(Field ionization intensity of helium). The extraction voltage for the argon gas obtained from this relational expression is stored in the storage section 302. After setting the extraction voltage for the argon gas, which is obtained from the relational expression, the extraction voltage is actually changed to around that extraction voltage, and the current amount of the ion beam 11 at that time is measured. It is also possible to reset the extraction voltage at which the maximum current amount is obtained as the extraction voltage for the argon gas.

Next, the extraction voltage is set to the extraction voltage for the argon gas, and the argon gas is gradually introduced additionally so that the pressure becomes around the discharge start pressure of the argon gas. The current amount of the ion beam 11 at this time is measured, and the gas pressure at the time of the maximum current amount is stored in the storage section 302 as the gas pressure for the argon gas.

Next, the ion beam 11 is scanned and applied to the specimen 13, the secondary electrons generated from the specimen 13 are detected by the detector 14, the observation image is formed in the image formation section 304, and the formed observation image is displayed on the display unit 17. While confirming the displayed observation image, the contrast and the brightness are adjusted so as to be appropriate for observation. The set values of the contrast and the brightness, which are adjusted at this time, are stored in the storage section 302 as the set values of the contrast and the brightness for the argon gas.

By the above-mentioned steps, the extraction voltage, the emitter temperature, the gas pressure, the set values for the contrast and the brightness for the argon gas have been set in the storage section 302.

Further, a vacuum gauge installed in the ion generation chamber 21 has different detection sensitivity depending on the gas types. Therefore, in order to covert the vacuum degree shown by the vacuum gauge according to the gas type, the converting value is stored in the storage section 302 for each of the gas types. When the gas type is switched, the control section 301 reads out the converting value from the storage section 302, and converts the vacuum degree. The converted value is displayed on the display unit 17.

(4) Gas Switching

The control section 301 reads out the setting conditions for the helium gas from the storage section 302, and sends the conditions to the gas control section 104, the heater 1b, the voltage control section 27, the blanking electrode 105, and the adjustment section 303 for adjusting the contrast and the brightness of the observation image, to thereby set the conditions. With this, the specimen 13 is irradiated with the helium ion beam from the emitter 1. Then, the specimen 13 is observed. Next, the input section 106 sends, to the control section 301, an instruction of switching the gas type to argon. The control section 301 reads out the setting conditions for the argon gas from the storage section 302, and sends the conditions to the gas control section 104, the heater 1b, the voltage control section 27, the blanking electrode 105, and the adjustment section 303 for adjusting the contrast and the brightness of the observation image, to thereby set the conditions. Then the extraction voltage is set to 0 V, the helium gas in the ion generation chamber 21 is exhausted, and the argon gas is introduced. During this operation, the heater 1b is in a heating state. With this, it is possible to prevent impurities from adsorbing onto the emitter 1. Then, the specimen 13 is irradiated with the argon ion beam from the emitter 1. Thus, the specimen 13 is processed.

As described above, the setting conditions corresponding to the respective gas types are stored in advance. By performing setting and then execution for each of the gas types, the gas type may be smoothly switched without discharging the emitter, and the specimen may be irradiated with the ion beam under optimum conditions.

What is claimed is:

1. A focused ion beam apparatus, comprising:
an emitter;
a heater for heating the emitter to regulate a temperature of the emitter;
an ion source gas supply unit for supplying ion source gases of a plurality of gas types to the emitter;
an extraction electrode that coacts with the emitter to form an electric field which ionizes the gas into gas ions on the emitter and that extracts the ions from the emitter;
a lens system for focusing the ions;
a specimen stage on which a specimen is to be placed, the specimen being irradiated with an ion beam focused by the lens system;
a detector for detecting secondary charged particles emitted from the specimen;
an image formation section for forming an observation image of the specimen from a detection signal of the detector;
a display unit for displaying the observation image;
an adjustment section for adjusting a contrast and a brightness of the observation image;
a storage section for storing, for each of the plurality of gas types, a set temperature of the emitter, a gas pressure of corresponding one of the ion source gases, an extraction voltage to be applied to the extraction electrode, a set value of the contrast, and a set value of the brightness;
an input section for selecting a gas type from the plurality of gas types and inputting the selected gas type; and
a control section for reading out, from the storage section, the set temperature, the gas pressure, the extraction voltage, and the set value of the contrast and the set value of the brightness, which correspond to the input gas type, and respectively setting the heater, the ion source gas supply unit, the extraction electrode, and the adjustment section,
wherein the ion source gas supply unit comprises a plurality of gas nozzles each for supplying a different ion source gas to the emitter, and a gas control section that is controlled by the control section to control the gas flow through the gas nozzles based on the input gas type.

2. A focused ion beam apparatus, comprising:
an emitter;
a heater that heats the emitter to regulate the temperature of the emitter;
an ion source gas supply unit configured to supply different ion source gases to the emitter;
an extraction electrode that coacts with the emitter to form an electric field which ionizes the gas into gas ions on the emitter and that extracts the ions from the emitter;
a lens system for focusing the extracted ions into a focused ion beam;
a specimen stage for supporting a specimen to be irradiated with the focused ion beam;
a detector for detecting secondary charged particles emitted from the specimen;
an image formation section configured to form an observation image of the specimen from a detection signal of the detector;
a display unit that displays the observation image;
an adjustment section for adjusting a contrast and a brightness of the observation image;
a storage section that stores, for each of the different ion source gases, set values of temperature of the emitter, gas pressure, an extraction voltage to be applied to the extraction electrode, image contrast, and image brightness;
an input section for selecting one of the different ion source gases and inputting the selected ion source gas; and
a control section configured to read out, from the storage section, the set values of temperature, gas pressure, extraction voltage, image contrast, and image brightness, which correspond to the selected ion source gas, and switch the read-out set values to the heater, the ion source gas supply unit, the extraction electrode, and the adjustment section,
wherein the ion source gas supply unit comprises a plurality of gas nozzles each for supplying a different ion source gas to the emitter, and a gas control section that is controlled by the control section to control the gas flow through the gas nozzles based on the selected ion source gas.

3. A focused ion beam apparatus, comprising:
a gas field ion gun unit having an emitter, an ion source gas supply unit configured to supply different ion source gases to the emitter so that the supplied gas adsorbs on the surface of the emitter, a heater that heats the emitter to regulate the temperature thereof, and an extraction electrode that, in response to an applied extraction voltage, creates an electric field between the emitter and the extraction electrode that ionizes the gas adsorbed on the surface of the emitter and that extracts gas ions from the emitter;
a lens system that focuses the extracted ions into a focused ion beam for irradiating a specimen;
a detector that detects secondary charged particles emitted from the specimen in response to irradiation thereof by the focused ion beam and outputs a corresponding detection signal;
an image formation section that forms an image of the specimen based on the detection signal;
a display unit that displays the image;
an adjustment section that adjusts the contrast and the brightness of the displayed image;
a storage section configured to store, for each different ion source gas, set values of emitter temperature, gas pressure, extraction voltage, image contrast and image brightness;
an input section that selects one of the different ion source gases and inputs the selected ion source gas; and
a control section configured to read out from the storage section the set values of emitter temperature, gas pressure, extraction voltage, image contrast and image brightness that correspond to the selected ion source gas, and switch the read-out set values to the heater, the ion source gas supply unit, the extraction electrode and the adjustment section,
wherein the ion source gas supply unit comprises a plurality of gas nozzles each for supplying a different ion source gas to the emitter, and a gas control section that is controlled by the control section to control the gas flow through the gas nozzles based on the selected ion source gas.

4. A focused ion beam apparatus, comprising:

a gas field ion gun unit having an emitter, an ion source gas supply unit configured to supply different ion source gases to the emitter so that the supplied gas adsorbs on the surface of the emitter, a heater that heats the emitter to regulate the temperature thereof, and an extraction electrode that, in response to an applied extraction voltage, creates an electric field between the emitter and the extraction electrode that ionizes the gas adsorbed on the surface of the emitter and that extracts gas ions from the emitter;

a lens system that focuses the extracted ions into a focused ion beam for irradiating a specimen;

a detector that detects secondary charged particles generated by the specimen in response to irradiation thereof by the focused ion beam and outputs a corresponding detection signal;

an image formation section that forms an image of the specimen based on the detection signal;

a display unit that displays the image;

a storage section configured to store, for each different ion source gas, a set value of extraction voltage to be applied to the extraction electrode;

an input section that selects one of the different ion source gases to be supplied by the ion source gas supply unit to the emitter; and a control section configured to switch between the stored set values of the extraction voltage and apply the set value of extraction voltage that corresponds to the ion source gas selected by the input section.

5. A focused ion beam apparatus according to claim 4; wherein the ion source gas supply unit comprises a plurality of gas nozzles each for supplying a different ion source gas to the emitter, and a gas control section that is controlled by the control section to control the gas flow through the gas nozzles based on the selected ion source gas.

6. A focused ion beam apparatus according to claim 4; wherein the control section is configured to switch between a set value of the extraction voltage that corresponds to an ion source gas used for observing the specimen and a set value that corresponds to an ion source gas used for processing the specimen.

7. A focused ion beam apparatus according to claim 4; wherein the ion source gas supply unit is configured to supply to the emitter a mixed gas comprised of different ion source gases.

* * * * *